US011804365B2

(12) United States Patent
Takeda et al.

(10) Patent No.: US 11,804,365 B2
(45) Date of Patent: Oct. 31, 2023

(54) SUBSTRATE PROCESSING APPARATUS, PLASMA GENERATING APPARATUS, AND METHOD OF MANUFACTURING SEMICONDUCTOR DEVICE

(71) Applicant: KOKUSAI ELECTRIC CORPORATION, Tokyo (JP)

(72) Inventors: Tsuyoshi Takeda, Toyama (JP); Daisuke Hara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/681,393

(22) Filed: Feb. 25, 2022

(65) Prior Publication Data
US 2022/0181125 A1 Jun. 9, 2022

Related U.S. Application Data

(63) Continuation of application No. PCT/JP2019/034502, filed on Sep. 2, 2019.

(51) Int. Cl.
*H01J 37/32* (2006.01)

(52) U.S. Cl.
CPC .. *H01J 37/32559* (2013.01); *H01J 37/32091* (2013.01); *H01J 37/32541* (2013.01); *H01J 37/32568* (2013.01); *H01J 37/32724* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 2009/0071405 A1* | 3/2009 | Miyashita | ......... | H01J 37/32559 118/723 R |
| 2009/0120365 A1* | 5/2009 | Suda | ................. | H01J 37/32541 118/728 |
| 2009/0255468 A1* | 10/2009 | Yamamoto | .......... | H01L 21/3185 118/723 E |
| 2010/0130009 A1* | 5/2010 | Ishimaru | ................. | C23C 16/52 156/345.43 |
| 2014/0170859 A1 | 6/2014 | Yamawaku et al. | | |

(Continued)

FOREIGN PATENT DOCUMENTS

| | | |
|---|---|---|
| JP | 2001-059527 A | 3/2001 |
| JP | 2014-120564 A | 6/2014 |

(Continued)

OTHER PUBLICATIONS

International Search Report and English Translation, PCT/JP2019/034502, dated Nov. 5, 2019.

(Continued)

*Primary Examiner* — Jeffrie R Lund
*Assistant Examiner* — Tiffany Z Nuckols
(74) *Attorney, Agent, or Firm* — Volpe Koenig

(57) ABSTRACT

There is provided is a technique that includes: a process chamber in which at least one substrate is processed; and at least one buffer chamber in which plasma is formed, wherein the at least one buffer chamber includes at least two application electrodes of different lengths to which high frequency electric power is applied, and a reference electrode subjected to a reference potential.

18 Claims, 10 Drawing Sheets

(56) References Cited

U.S. PATENT DOCUMENTS

2015/0235813 A1* 8/2015 Miura ................. C23C 16/4584
  156/345.28
2018/0182601 A1* 6/2018 Takeda .................. C23C 16/505
2019/0157049 A1* 5/2019 Sato .................. H01L 21/02274

FOREIGN PATENT DOCUMENTS

| JP | 2015-092637 A | 5/2015 |
| JP | 2015-179770 A | 10/2015 |
| TW | 201813452 | 4/2018 |

OTHER PUBLICATIONS

Taiwan Office Action and English Translation, dated Sep. 13, 2021 in TW Appln. No. 109127642.

* cited by examiner

SUBSTRATE PROCESSING APPARATUS, PLASMA GENERATING APPARATUS, AND METHOD OF MANUFACTURING SEMICONDUCTOR DEVICE

CROSS-REFERENCE TO RELATED APPLICATION

This application is a Bypass Continuation Application of PCT International Application No. PCT/JP2019/034502, filed on Sep. 2, 2019, the disclosure of which is incorporated herein in its entirety by reference.

TECHNICAL FIELD

The present disclosure relates to a substrate processing apparatus, a plasma generating apparatus, and a method of manufacturing a semiconductor device.

BACKGROUND

As a process of manufacturing a semiconductor device, substrate processing of forming or removing various films such as an insulating film, a semiconductor film, a conductor film, and the like on a substrate accommodated in a process chamber of a substrate processing apparatus by activating a precursor gas, a reaction gas, and the like by plasma and supplying the activated gases to the substrate may be carried out.

In mass production devices in which fine patterns are formed, a processing temperature is lowered to suppress diffusion of impurities and to enable use of materials with low heat resistance such as organic materials.

It is common to perform substrate processing by using plasma to solve such a problem, but when processing a plurality of substrates at the same time, plasma and active species generated by the plasma are supplied with the same amount to each substrate. When the plasma is confined in a space called a buffer chamber and the active species are supplied to the plurality of substrates via holes, the active species tends to be insufficiently supplied to substrates in the vicinity of a large space, which may make processing performances differ among the substrates.

SUMMARY

Some embodiments of the present disclosure provide a technique capable of reducing variations in substrate processing performance on a plurality of substrates.

According to some embodiments of the present disclosure, there is provided a technique that includes: a process chamber in which at least one substrate is processed; and at least one buffer chamber in which plasma is formed, wherein the at least one buffer chamber includes at least two application electrodes of different lengths to which high frequency electric power is applied, and a reference electrode subjected to a reference potential.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the present disclosure will be now described with reference to FIGS. 1 to 5B.

(1) Configuration of Substrate Processing Apparatus (Heater)

Figure 1:
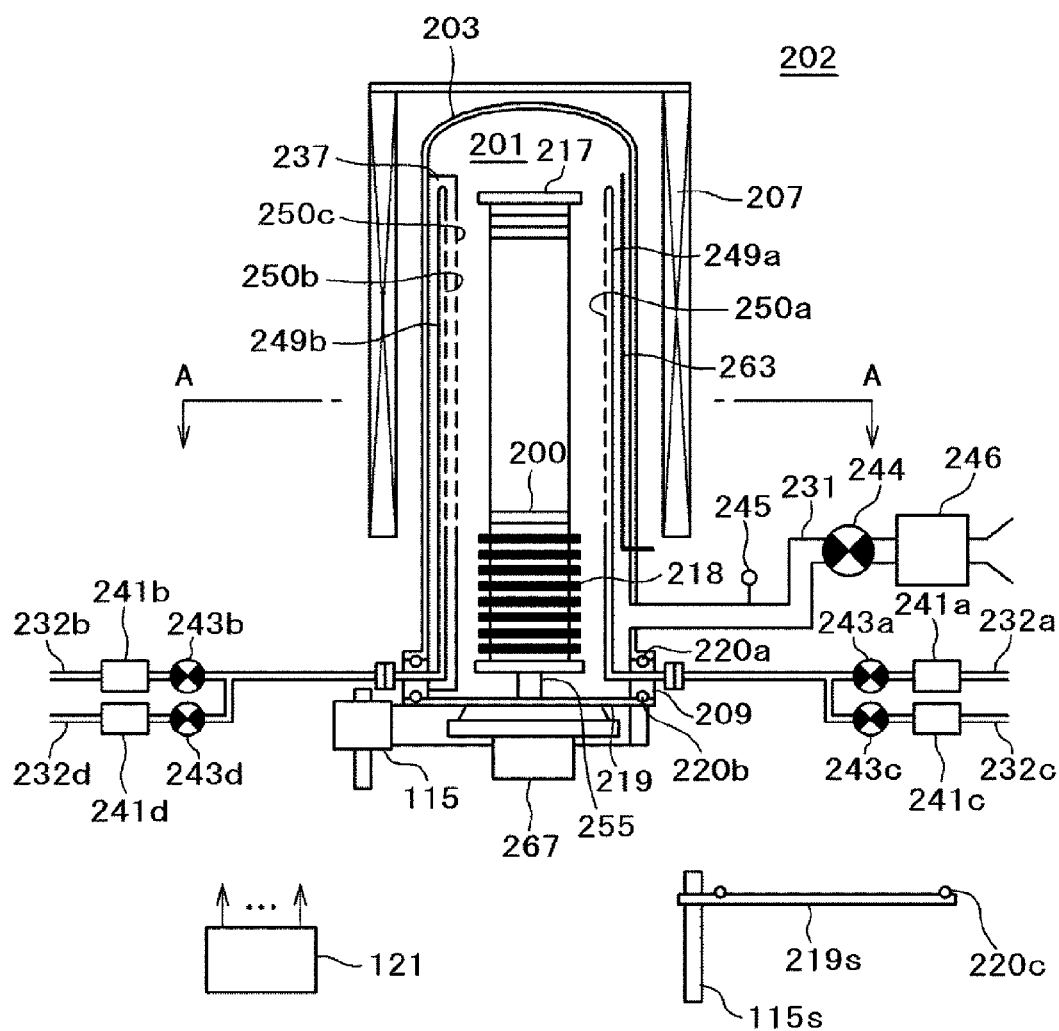
FIG. 1 is a schematic configuration view of a vertical process furnace of a substrate processing apparatus suitably used in embodiments of the present disclosure, in which a portion of the process furnace is shown in a vertical cross section.

As shown in FIG. 1, a process furnace 202 includes a heater 207 as a heating device (a heating mechanism). The heater 207 is formed in a cylindrical shape and is supported by a heater base (not shown) serving as a holding plate to be vertically installed. The heater 207 functions as an activation mechanism (an exciter) configured to thermally activate (excite) a gas, as will be described later.

(Process Chamber)

A reaction tube 203 is disposed inside the heater 207 to be concentric with the heater 207. The reaction tube 203 is made of, for example, a heat resistant material such as quartz ($SiO_2$) or silicon carbide (SiC) and is formed in a cylindrical shape with its upper end closed and its lower end opened. A manifold 209 is disposed under the reaction tube 203 to be concentric with the reaction tube 203. The manifold 209 is made of, for example, metal such as stainless steel (SUS) and is formed in a cylindrical shape with both of its upper and lower ends opened. The upper end portion of the manifold 209 engages with a lower end portion of the reaction tube 203 to support the reaction tube 203. An O-ring 220a serving as a seal is installed between the manifold 209 and the reaction tube 203. As the manifold 209 is supported by the heater base, the reaction tube 203 is vertically installed. A process container (reaction container) mainly includes the reaction tube 203 and the manifold 209. A process chamber 201 is formed in a hollow cylindrical portion of the process container. The process chamber 201 is configured to be capable of accommodating a plurality of wafers 200 as substrates. The process container is not limited to the above-described configuration, and the reaction tube 203 may be referred to as the process container.

(Gas Supplier)

Nozzles 249a and 249b are installed in the process chamber 201 to penetrate a sidewall of the manifold 209. Gas supply pipes 232a and 232b are connected to the nozzles 249a and 249b, respectively. In this way, the two nozzles 249a and 249b and the two gas supply pipes 232a and 232b are installed at the process container, thereby allowing plural kinds of gases to be supplied into the process chamber 201. When the reaction tube 203 is used as the process container, the nozzles 249a and 249b may be installed to penetrate a sidewall of the reaction tube 203.

Mass flow controllers (MFCs) 241a and 241b, which are flow rate controllers (flow rate control parts), and valves 243a and 243b, which are opening/closing valves, are installed at the gas supply pipes 232a and 232b, respectively, sequentially from the corresponding upstream sides. Gas supply pipes 232c and 232d configured to supply an inert gas are connected to the gas supply pipes 232a and 232b at the downstream sides of the valves 243a and 243b, respectively. MFCs 241c and 241d and valves 243c and 243d are installed at the gas supply pipes 232c and 232d, respectively, sequentially from the corresponding upstream sides.

Figure 2:
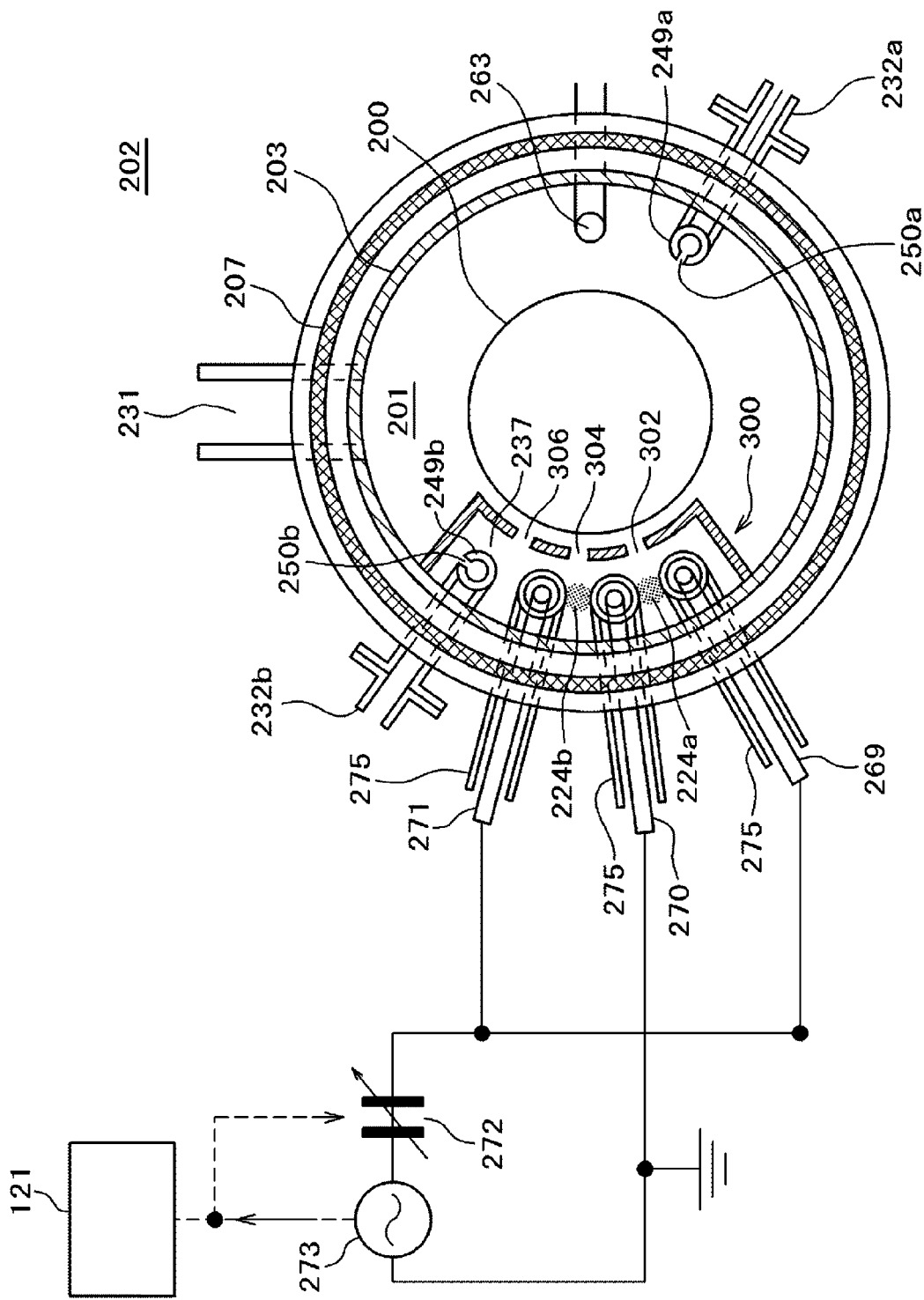
FIG. 2 is an A-A sectional view of the substrate processing apparatus shown in FIG. 1.

As shown in FIG. 2, the nozzle 249a is installed in a space between an inner wall of the reaction tube 203 and the wafers 200 to extend upward along a stack direction of the wafers 200 from a lower portion to an upper portion of the inner wall of the reaction tube 203. Specifically, the nozzle 249a is installed in a region horizontally surrounding a wafer arrangement region (mounting region) in which the wafers 200 are arranged (mounted) at a lateral side of the wafer arrangement region, along the wafer arrangement region. That is, the nozzle 249a is installed in a direction perpendicular to surfaces (flat surfaces) of the wafers 200 at a lateral side of end portions (peripheral edge portions) of the wafers 200, which are loaded into the process chamber 201. A gas supply hole 250a configured to supply a gas is formed on the side surface of the nozzle 249a. The gas supply hole 250a is opened toward a center of the reaction tube 203 to allow a gas to be supplied toward the wafers 200. A plurality of gas supply holes 250a are formed from the lower portion to the upper portion of the reaction tube 203 and are provided with the same opening area at the same opening pitch.

Figure 3:
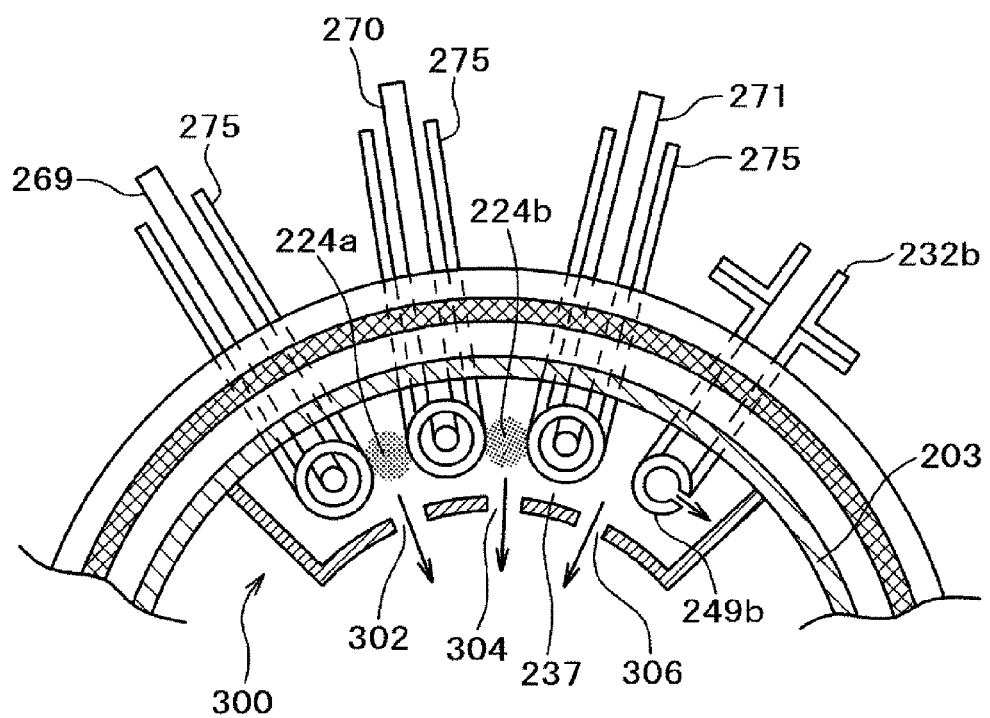
FIG. 3 is an enlarged cross-sectional view that explains a buffer structure of the substrate processing apparatus suitably used in the embodiments of the present disclosure.

The nozzle 249b is connected to a leading end of the gas supply pipe 232b. The nozzle 249b is installed in a buffer chamber 237 serving as a gas dispersion space. As shown in FIG. 2, the buffer chamber 237 is installed in an annular space in a plane view between the inner wall of the reaction tube 203 and the wafers 200 along a stack direction of the wafers 200 from the lower portion to the upper portion of the inner wall of the reaction tube 203. That is, the buffer chamber 237 is formed by a buffer structure (partition wall) 300 along the wafer arrangement region in a region horizontally surrounding the wafer arrangement region at the lateral side of the wafer arrangement region. The buffer structure 300 is made of an insulating material which is a heat resistant material such as quartz or SiC. Gas supply ports 302, 304, and 306 configured to supply a gas are formed on an arc-shaped wall surface of the buffer structure 300. As shown in FIGS. 2 and 3, the gas supply ports 302, 304, and 306 are respectively opened toward the center of the reaction tube 203 at positions of the wall surface opposite to a plasma generation region 224a between rod-shaped electrodes 269 and 270, a plasma generation region 224b between rod-shaped electrodes 270 and 271, and a region between the rod-shaped electrode 271 and the nozzle 249b, which will be described later, thereby allowing a gas to be supplied toward the wafers 200. A plurality of gas supply ports 302, 304, and 306 are formed between the lower portion and the upper portion of the reaction tube 203 and are formed with the same opening area at the same opening pitch.

The nozzle 249b is installed to extend upward along the stack direction of the wafers 200 from the lower portion to the upper portion of the inner wall of the reaction tube 203. Specifically, the nozzle 249b is installed in a region horizontally surrounding the wafer arrangement region in which the wafers 200 are arranged at the lateral side of the wafer arrangement region inside the buffer structure 300, along the wafer arrangement region. That is, the nozzle 249b is installed in a direction perpendicular to the surfaces of the wafers 200 at the lateral side of the end portions of the wafers 200, which are loaded into the process chamber 201. A gas supply hole 250b configured to supply a gas is formed on the side surface of the nozzle 249b. The gas supply hole 250b is opened toward a wall surface formed in the radial direction with respect to the arc-shaped wall surface of the buffer structure 300, thereby allowing a gas to be supplied toward the wall surface. Thus, a reaction gas is distributed in the buffer chamber 237 and is not directly sprayed to the rod-shaped electrodes 269 to 271, thereby suppressing generation of particles. As with the gas supply holes 250a, a plurality of gas supply holes 250b are formed between the lower portion and the upper portion of the reaction tube 203.

In this way, in the embodiments, a gas is transferred via the nozzles 249a and 249b and the buffer chamber 237 arranged in an annular longitudinal space, that is, a cylindrical space, in a plane view, defined by the inner wall of the side wall of the reaction tube 203 and the end portions of the plurality of wafers 200 arranged in the reaction tube 203. Then, the gas is first ejected into the reaction tube 203 near the wafers 200 from the gas supply holes 250a and 250b and the gas supply ports 302, 304, and 306 formed in the nozzles 249a and 249b and the buffer chamber 237 respectively. The main flow of the gas in the reaction tube 203 is in a direction parallel to the surfaces of the wafers 200, that is, in a horizontal direction. With such a configuration, the gas may be uniformly supplied to each wafer 200, such that uniformity of film thickness of the film formed on each wafer 200 may be enhanced. A gas flowing on the surfaces of the wafers 200, that is, the residual gas after reaction flows toward an exhaust port, that is, an exhaust pipe 231 to be described later. However, the direction of the flow of the residual gas is appropriately specified depending on the position of the exhaust port, and is not limited to the vertical direction.

A precursor containing a predetermined element, for example, a silane precursor gas containing silicon (Si) as the predetermined element, is supplied from the gas supply pipe 232a into the process chamber 201 via the MFC 241a, the valve 243a, and the nozzle 249a.

The silane precursor gas refers to a gaseous silane precursor, for example, a gas obtained by vaporizing a silane precursor in a liquefied state at normal temperature and normal pressure, a silane precursor in a gaseous state at normal temperature and normal pressure, and the like. When the term "precursor" is used herein, it may indicate a case of including a "liquid precursor in a liquefied state," a case of including a "precursor gas in a gaseous state," or a case of including both of them.

An example of the silane precursor gas may include a precursor gas containing Si and an amino group (amine group), that is, an aminosilane precursor gas. The aminosilane precursor is a silane precursor containing an amino group and also a silane precursor containing an alkyl group such as a methyl group, an ethyl group, or a butyl group, and a precursor contains at least Si, nitrogen (N), and carbon (C). That is, the aminosilane precursor referred to herein may be an organic-based precursor or an organic aminosilane precursor.

An example of the aminosilane precursor gas may include a bis-tertiary-butyl-amino-silane ($SiH_2[NH(C_4H_9)]_2$, abbreviation: BTBAS) gas. The BTBAS may be a precursor gas containing one Si in one molecule, containing a Si—N bond and a N—C bond, and not containing a Si—C bond. The BTBAS gas acts as a Si source.

When using a liquid precursor in a liquefied state at normal temperature and normal pressure, like BTBAS, the liquefied precursor is vaporized by a vaporization system such as a vaporizer or a bubbler and is supplied as a silane precursor gas (BTBAS gas, and the like).

A reactant different in chemical structure from the precursor, for example, an oxygen (O)-containing gas, is supplied from the gas supply pipe 232b into the process chamber 201 via the MFC 241b, the valve 243b, and the nozzle 249b.

The O-containing gas acts as an oxidant (oxidizing gas), that is, an O source. An example of the O-containing gas may include an oxygen ($O_2$) gas, water vapor ($H_2O$ gas), or the like. When the $O_{gas}$ is used as the oxidant, this gas is plasma-excited by using, for example, a plasma source to be described later and is supplied as an exciting gas ($O_2$*gas).

An inert gas, for example, a nitrogen ($N_2$) gas, is supplied from the gas supply pipes 232c and 232d into the process chamber 201 via the MFCs 241c and 241d, the valves 243c and 243d, and the nozzles 249a and 249b, respectively.

A precursor supply system as a first gas supply system mainly includes the gas supply pipe 232a, the MFC 241a, and the valve 243a. A reactant supply system as a second gas supply system mainly includes the gas supply pipe 232b, the MFC 241b, and the valve 243b. An inert gas supply system mainly includes the gas supply pipes 232c and 232d, the MFCs 241c and 241d, and the valves 243c and 243d. The precursor supply system, the reactant supply system, and the inert gas supply system are also simply referred to as a gas supply system (a gas supplier).

(Substrate Support)

As shown in FIG. 1, a boat 217 serving as a substrate support (substrate support part) is configured to support a plurality of wafers 200, for example, 25 to 200 wafers 200, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat resistant material such as quartz or SiC. Heat insulating plates 218 made of a heat resistant material such as quartz or SiC are supported in multiple stages below the boat 217. This configuration makes it difficult to transfer heat from the heater 207 to the seal cap 219. However, the embodiments of the present disclosure are not limited to the above-described form. For example, instead of installing the heat insulating plates 218, a heat insulating cylinder configured as a cylindrical member made of a heat resistant material such as quartz or SiC may be installed below the boat 217.

(Plasma Generator)

Next, a plasma generator will be described with reference to FIGS. 1 to 4.

As shown in FIG. 2, by using capacitively coupled plasma (abbreviation: CCP), plasma is generated inside the buffer chamber 237, which is a vacuum partition wall made of quartz or the like, when the reaction gas is supplied.

Figure 4:
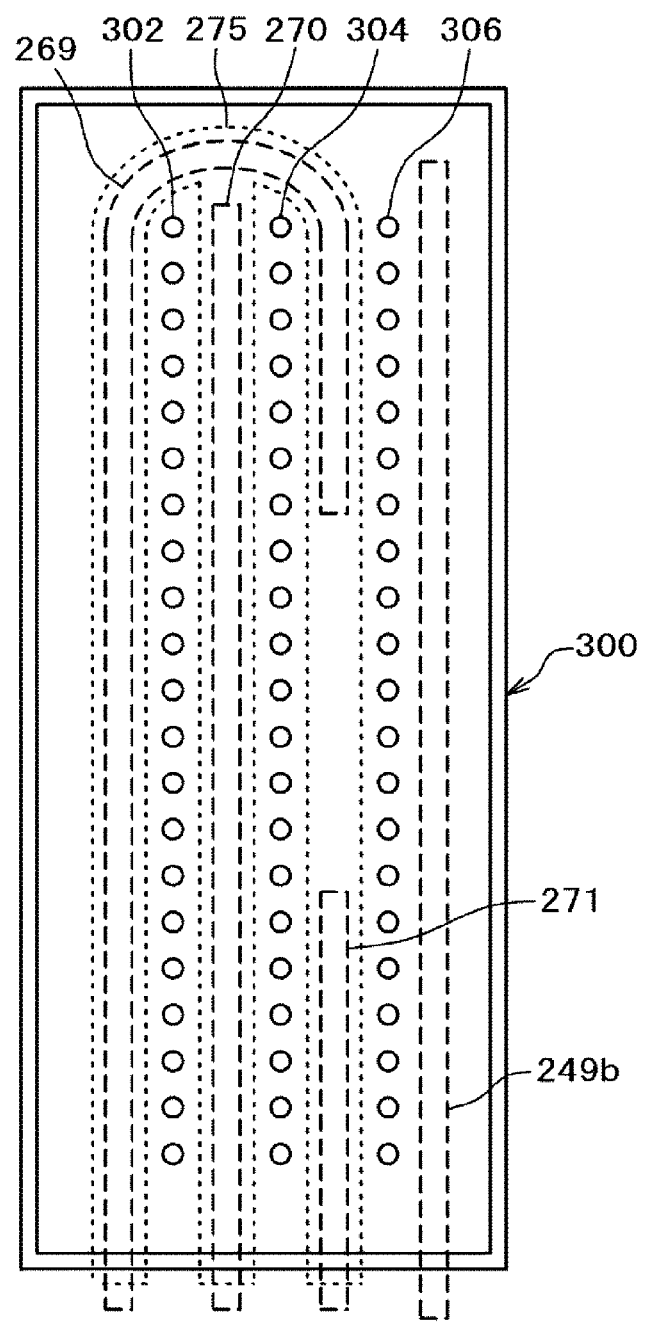
FIG. 4 is a schematic view that explains a buffer structure of a substrate processing apparatus suitably used in embodiments of the present disclosure.

In examples of the embodiments of the present disclosure, as shown in FIGS. 3 and 4, three rod-shaped electrodes 269, 270, and 271, which are made of a conductor and formed in a thin and elongated structure, are arranged in the buffer chamber 237 along the stack direction of the wafers 200 to span from the lower portion to the upper portion of the reaction tube 203. Each of the rod-shaped electrodes 269, 270, and 271 is installed parallel to the nozzle 249b. Each of the rod-shaped electrodes 269, 270, and 271 is covered with and protected by an electrode protection tube 275 over a region spanning from an upper portion to a lower portion thereof. The electrode protection tube 275 includes a quartz tube that protects both the rod-shaped electrodes 269 and 271 and is formed in a U-shape at the upper portion of the buffer chamber 237, and a quartz tube that protects the rod-shaped electrode 270. In the embodiments of the present disclosure, the above-mentioned two quartz tubes are connected at the upper portions thereof and integrated in the buffer chamber 237, but they may be individually separated, and may be formed in a constricted shape in the connection portion thereof to serve as a stopper with respect to the rod-shaped electrode 270 such that the rod-shaped electrodes 269 and 270 do not come into contact with each other. The rod-shaped electrode 269 is disposed to be inserted from the lower portion of the electrode protection tube 275 and folded back at the bent portion of the above-mentioned U-shape such that its leading end is located at the upper portion of the electrode protection tube 275. That is, the rod-shaped electrode 269 is formed in the U-shape in a direction opposite to the insertion direction thereof. Further, the rod-shaped electrode 270 is disposed such that its leading end is located at the upper portion of the electrode protection tube 275, and the rod-shaped electrode 271 is disposed such that its leading end is located at the lower portion of the electrode protection tube 275. Lengths of the rod-shaped electrode 269 and the rod-shaped electrode 271 are different from each other. More specifically, the lengths of the rod-shaped electrode 269 and the rod-shaped electrode 271 are different from each other in the stack direction of the wafers 200. For example, the rod-shaped electrode 269 is longer than the rod-shaped electrode 271. Further, the leading end of the rod-shaped electrode 269 and the leading end of the rod-shaped electrode 271 are arranged at a distance from each other. The leading end of the rod-shaped electrode 269 is located on the upper side of the electrode protection tube 275, but its length may be regulated such that the length is decreased by moving the leading end upward or increased by moving the leading end downward. The leading end of the rod-shaped electrode 271 is located on the lower side of the electrode protection tube 275, but its length may be regulated such that the length is increased by moving the leading end upward or decreased by moving the leading end downward. That is, it is possible to regulate the lengths of the rod-shaped electrode 269 and the rod-shaped electrode 271 within a range in which the rod-shaped electrode 269 and the rod-shaped electrode 271 do not come into contact with each other.

Figure 5A:
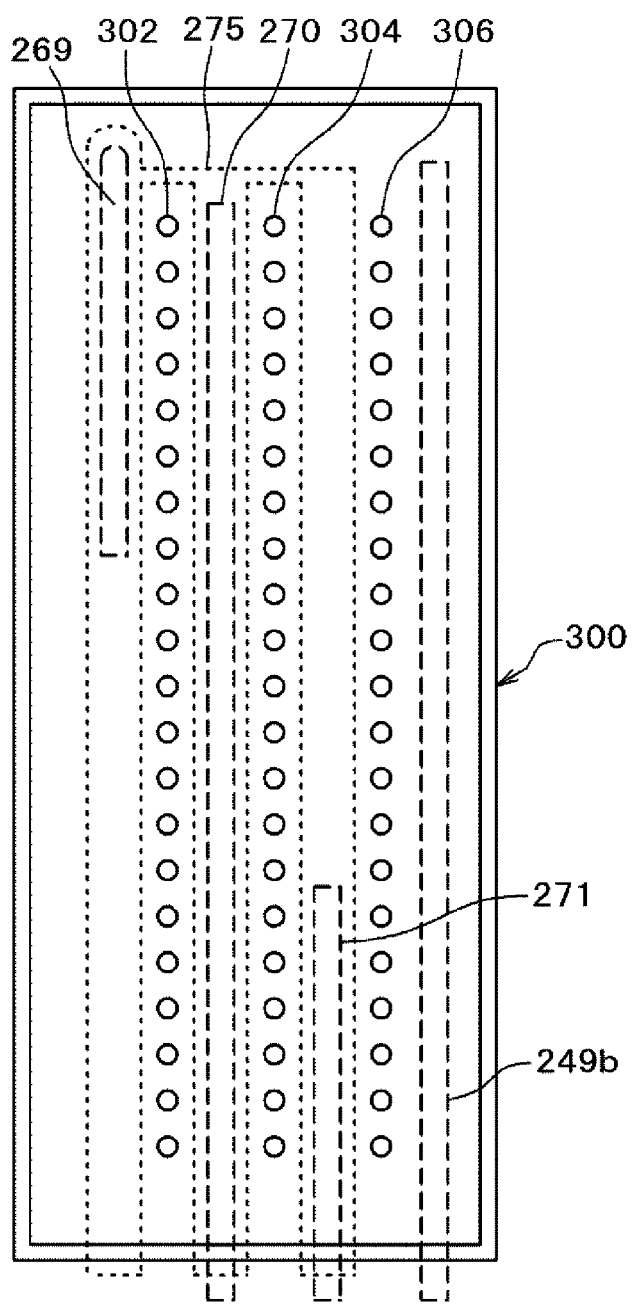
FIG. 5A is a schematic view that explains a buffer structure of a substrate processing apparatus suitably used in some embodiments of the present disclosure.
Figure 5B:
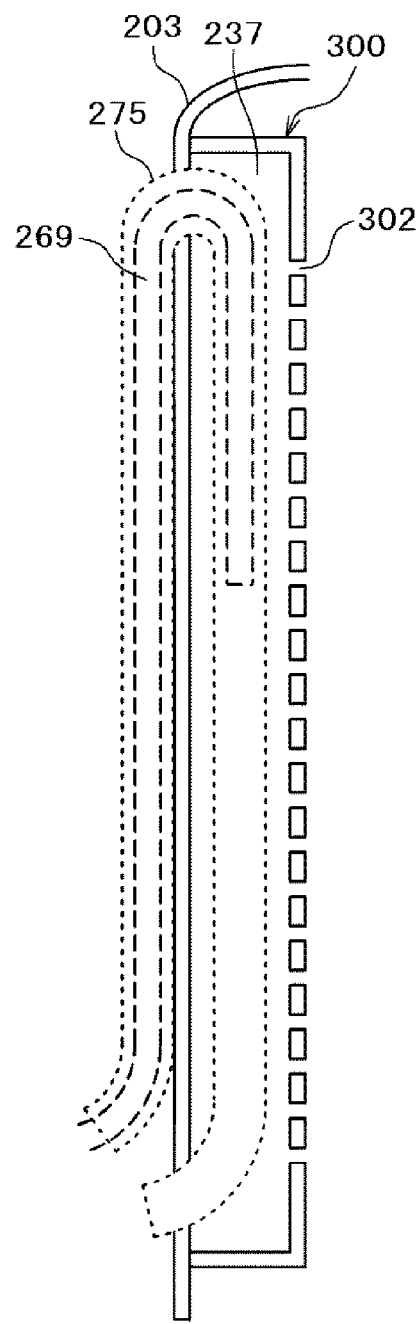
FIG. 5B is a vertical cross section of a schematic view that explains a buffer structure of a substrate processing apparatus suitably used in some embodiments of the present disclosure.

In some examples of the embodiments of the present disclosure, as shown in FIGS. 3, 5A, and 5B, three rod-shaped electrodes 269, 270, and 271, which are made of a conductor and formed in a thin and elongated structure, are arranged in the buffer chamber 237 along the stack direction of the wafers 200 to span from the lower portion to the upper portion of the reaction tube 203. Each of the rod-shaped electrodes 269, 270, and 271 is installed parallel to the nozzle 249b. Each of the rod-shaped electrodes 269, 270, and 271 is covered with and protected by an electrode protection tube 275 over a region spanning from an upper portion to a lower portion thereof. The electrode protection tube 275 includes a quartz tube that protects the rod-shaped electrode 269 and is formed in a U-shape extending inside and outside the upper portion of the buffer chamber 237, and a quartz tube that protects both the rod-shaped electrodes 270 and 271. In the embodiments of the present disclosure, the plurality of quartz tubes mentioned above are connected at the upper portions thereof and integrated in the buffer chamber 237, but they may be individually separated. The rod-shaped electrode 269 is disposed to be inserted from the lower portion of the electrode protection tube 275 on the outside of the reaction tube 203 and folded back at the bent portion of the above-mentioned U-shape such that its leading end is located at the upper portion of the electrode protection tube 275. That is, the rod-shaped electrode 269 is formed in the U-shape in a direction opposite to the insertion direction thereof. Further, the rod-shaped electrode 270 is disposed such that its leading end is located at the upper portion of the electrode protection tube 275, and the rod-shaped electrode 271 is disposed such that its leading end is located at the lower portion of the electrode protection tube 275. The rod-shaped electrode 269 and the rod-shaped electrode 271 are different in lengths from each other. More specifically, the lengths of the rod-shaped electrode 269 and the rod-shaped electrode 271 are different from each other in the stack direction of the wafers 200. For example, the rod-shaped electrode 269 is longer than the rod-shaped electrode 271. Further, the leading end of the rod-shaped electrode 269 is located on the upper side of the electrode protection tube 275, and its length may be regulated such that the length is decreased by moving the leading end upward or increased by moving the leading end downward. The leading end of the rod-shaped electrode 271 is located on the lower side of the electrode protection tube 275, and its length may be regulated such that the length is increased by moving the leading end upward or decreased by moving the leading end downward. In the embodiments of the present disclosure, one rod-shaped electrode 269 is inserted, but another shorter electrode may be inserted from the lower portion of the electrode protection tube 275 and may be arranged such that the leading end thereof is located at the lower portion of the electrode protection tube 275.

Also, in the aforementioned examples of the embodiments of the present disclosure, as shown in FIG. 2, among the rod-shaped electrodes 269, 270, and 271, the rod-shaped electrodes 269 and 271 as application electrodes, which are disposed at both ends thereof, are connected to a high frequency power supply 273 via a matcher 272 to apply high frequency electric power, and the rod-shaped electrode 270 as a reference electrode is connected to the earth, which is a reference potential, and is grounded and subjected to the reference potential. That is, the rod-shaped electrodes connected to the high frequency power supply 273 and the grounded rod-shaped electrode are alternately arranged. As the grounded rod-shaped electrode, the rod-shaped electrode 270 interposed between the rod-shaped electrodes 269 and 271 connected to the high frequency power supply 273 is used in common with respect to the rod-shaped electrodes 269 and 271. In other words, the grounded rod-shaped electrode 270 is disposed to be sandwiched between the rod-shaped electrodes 269 and 271 connected to the adjacent high frequency power supply 273, and the rod-shaped electrode 269 and the rod-shaped electrode 270, and similarly the rod-shaped electrode 271 and the rod-shaped electrode 270 are configured to be paired to generate plasma, respectively. That is, the grounded rod-shaped electrode 270 is used in common with respect to the rod-shaped electrodes 269 and 271 connected to two high frequency power supplies 273 adjacent to the rod-shaped electrode 270. Thus, the number of reference electrodes may be reduced. Then, by applying high frequency (RF) power from the high frequency power supply 273 to the rod-shaped electrodes 269 and 271, plasma is generated in the plasma generation region 224a between the rod-shaped electrodes 269 and 270 and in the plasma generation region 224b between the rod-shaped electrodes 270 and 271. A plasma generator (a plasma generating apparatus) as a plasma source mainly includes the rod-shaped electrodes 269, 270, and 271 and the electrode protection tube 275. The plasma source may include the matcher 272 and the high frequency power supply 273. As will be described later, the plasma source functions as a plasma exciter (an activation mechanism) that plasma-excites a gas, namely, excites (activates) the gas into a plasma state. Although two examples of the rod-shaped electrodes 269 and 271 are described as the application electrodes, at least two application electrodes may be used.

The electrode protection tube 275 is formed in a structure in which each of the rod-shaped electrodes 269, 270, and 271 may be inserted into the buffer chamber 237 while keeping each of the rod-shaped electrodes 269, 270, and 271 isolated from an internal atmosphere of the buffer chamber 237. In a case where an $O_2$ concentration within the electrode protection tube 275 is substantially equal to an $O_2$ concentration in the outside air (atmosphere), each of the rod-shaped electrodes 269, 270, and 271 inserted into the electrode protection tube 275 may be oxidized by heat generated from the heater 207. For this reason, by charging the interior of the electrode protection tube 275 with an inert gas such as a $N_2$ gas or by purging the interior of the electrode protection tube 275 with an inert gas such as a $N_2$ gas by using an inert gas purge mechanism, it is possible to reduce the 02 concentration within the electrode protection tube 275, thereby preventing oxidation of the rod-shaped electrodes 269, 270, and 271.

(Exhauster)

As shown in FIG. 1, the exhaust pipe 231 configured to exhaust an internal atmosphere of the process chamber 201 is installed in the reaction tube 203. As a vacuum-exhauster, a vacuum pump 246 is connected to the exhaust pipe 231 via a pressure sensor 245, which is a pressure detector (pressure detecting part) configured to detect an internal pressure of the process chamber 201, and an auto pressure controller (APC) valve 244, which is an exhaust valve (pressure regulator). The APC valve 244 is configured to perform or stop a vacuum-exhausting operation in the process chamber 201 by opening or closing the valve while the vacuum pump 246 is actuated, and is also configured to regulate the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246. The exhaust pipe 231 is not limited to being installed at the reaction pipe 203, but may be installed at the manifold 209 in the same manner as the nozzles 249a and 249b.

(Peripheral Device)

A seal cap 219, which serves as a furnace opening lid configured to hermetically seal a lower end opening of the manifold 209, is installed under the manifold 209. The seal cap 219 is configured to contact the lower end of the manifold 209 from the lower side in the vertical direction. The seal cap 219 is made of, for example, a metal material such as SUS and is formed in a disc shape. An O-ring 220b, which is a seal making contact with the lower end of the manifold 209, is installed at an upper surface of the seal cap 219.

A rotation mechanism 267 configured to rotate the boat 217 is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevation mechanism vertically installed outside the reaction tube 203. The boat elevator 115 is configured to be capable of loading/unloading the boat 217 into/out of the process chamber 201 by moving the seal cap 219 up or down.

The boat elevator 115 is configured as a transfer device (a transfer mechanism) which transfers the boat 217, that is, the wafers 200, into/out of the process chamber 201. In addition, a shutter 219s, which serves as a furnace opening lid configured to be capable of hermetically sealing a lower end opening of the manifold 209 while the seal cap 219 is descended by the boat elevator 115, is installed under the manifold 209. The shutter 219s is made of, for example, a metal material such as SUS and is formed in a disc shape. An O-ring 220c, which is a seal making contact with the lower end of the manifold 209, is installed at an upper surface of the shutter 219s. The opening/closing operation (elevation operation, rotation operation, or the like) of the shutter 219s is controlled by a shutter opening/closing mechanism 115s.

A temperature sensor 263 serving as a temperature detector is installed in the reaction tube 203. Based on temperature information detected by the temperature sensor 263, a state of supplying electric power to the heater 207 is regulated such that a temperature distribution of the interior of the process chamber 201 becomes a desired temperature distribution. The temperature sensor 263 is installed along the inner wall of the reaction tube 203 in the same manner as the nozzles 249a and 249b.

(Controller)

Figure 6:
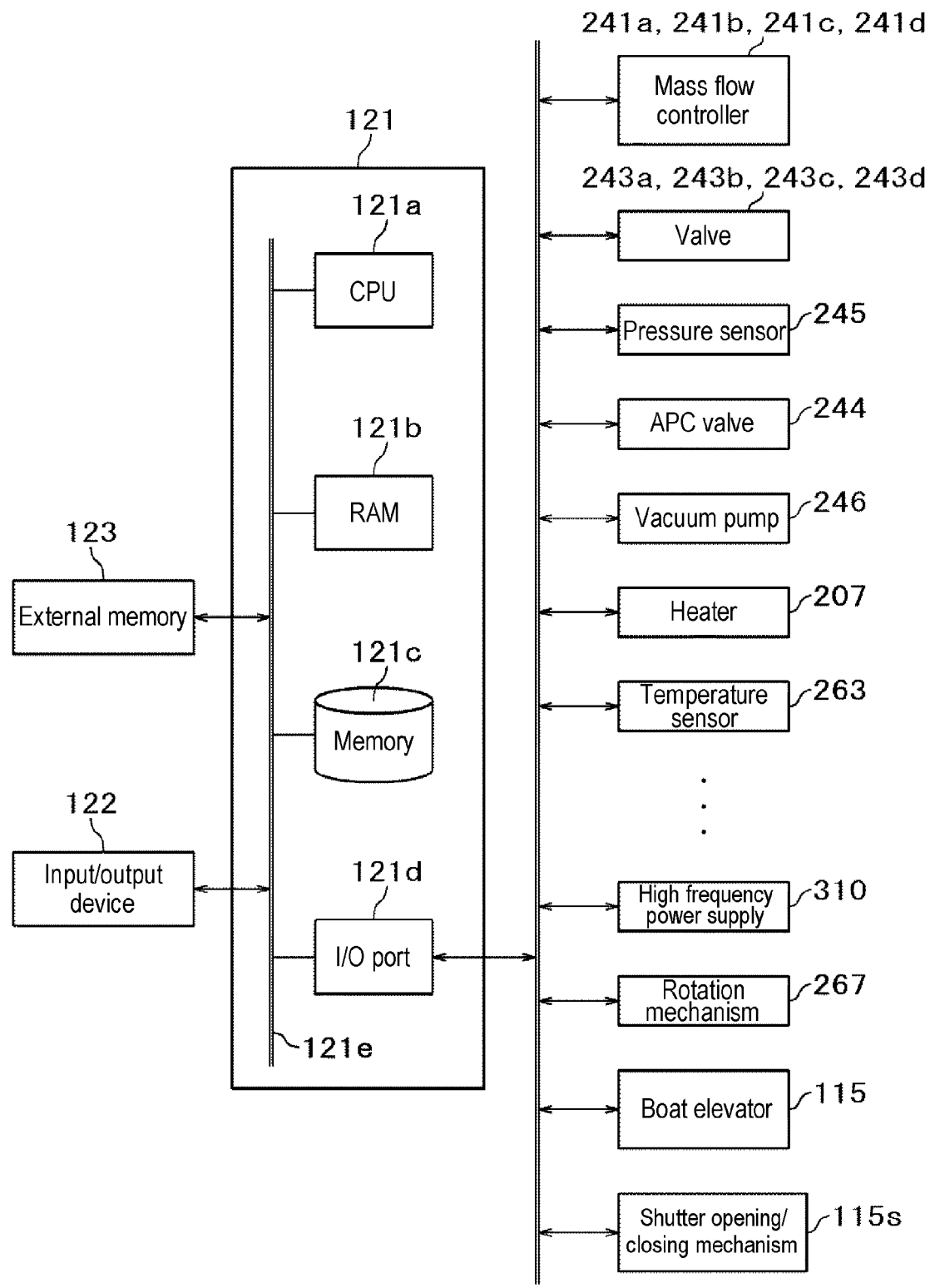
FIG. 6 is a schematic configuration diagram of a controller of the substrate processing apparatus shown in FIG. 1, in which an example of a control system of the controller is shown in a block diagram.

Next, a controller will be described with reference to FIG. 6. As shown in FIG. 6, a controller 121, which is a control part (control device), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121.

The memory 121c is configured by, for example, a flash memory, a hard disk drive (HDD), or the like. A control program that controls operations of a substrate processing apparatus and a process recipe, in which sequences and conditions of a film-forming process to be described later are written, are readably stored in the memory 121c. The process recipe functions as a program that causes the controller 121 to execute each sequence in various kinds of processes (film-forming processes), which will be described later, to obtain a desired result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, the shutter opening/closing mechanism 115s, the high frequency power supply 273, and the like.

The CPU 121a is configured to read and execute the control program from the memory 121c and is also configured to read the recipe from the memory 121c according to an input of an operation command from the input/output device 122. The CPU 121a is configured to be capable of controlling the rotation mechanism 267, the flow rate regulation operation of various kinds of gases by the MFCs 241a to 241d, the opening/closing operation of the valves 243a to 243d, the opening/closing operation of the APC valve 244, the pressure regulation operation performed by the APC valve 244 based on the pressure sensor 245, the actuating and stopping of the vacuum pump 246, the temperature regulation operation performed by the heater 207 based on the temperature sensor 263, the forward/backward rotation, rotation angle and rotation speed adjustment operation of the boat 217 by the rotation mechanism 267, the operation of moving the boat 217 up or down by the boat elevator 115, the opening/closing operation of the shutter 219s by the shutter opening/closing mechanism 115s, the supply of power of the high frequency power supply 273, and the like, according to contents of the read recipe.

The controller 121 may be configured by installing, on the computer, the aforementioned program stored in an external memory (for example, a magnetic disk such as a hard disk, an optical disc such as a CD, a magneto-optical disc such as a MO, a semiconductor memory such as a USB memory, or the like) 123. The memory 121c and the external memory 123 are configured as a computer-readable recording medium. Hereinafter, the memory 121c and the external memory 123 may be generally and simply referred to as a "recording medium." When the term "recording medium" is used herein, it may indicate a case of including the memory 121c, a case of including the external memory 123, or a case of including both the memory 121c and the external memory 123. Furthermore, the program may be provided to the computer by using a communication unit or communication means such as the Internet or a dedicated line, instead of using the external memory 123.

(2) Substrate Processing Process

Figure 7:
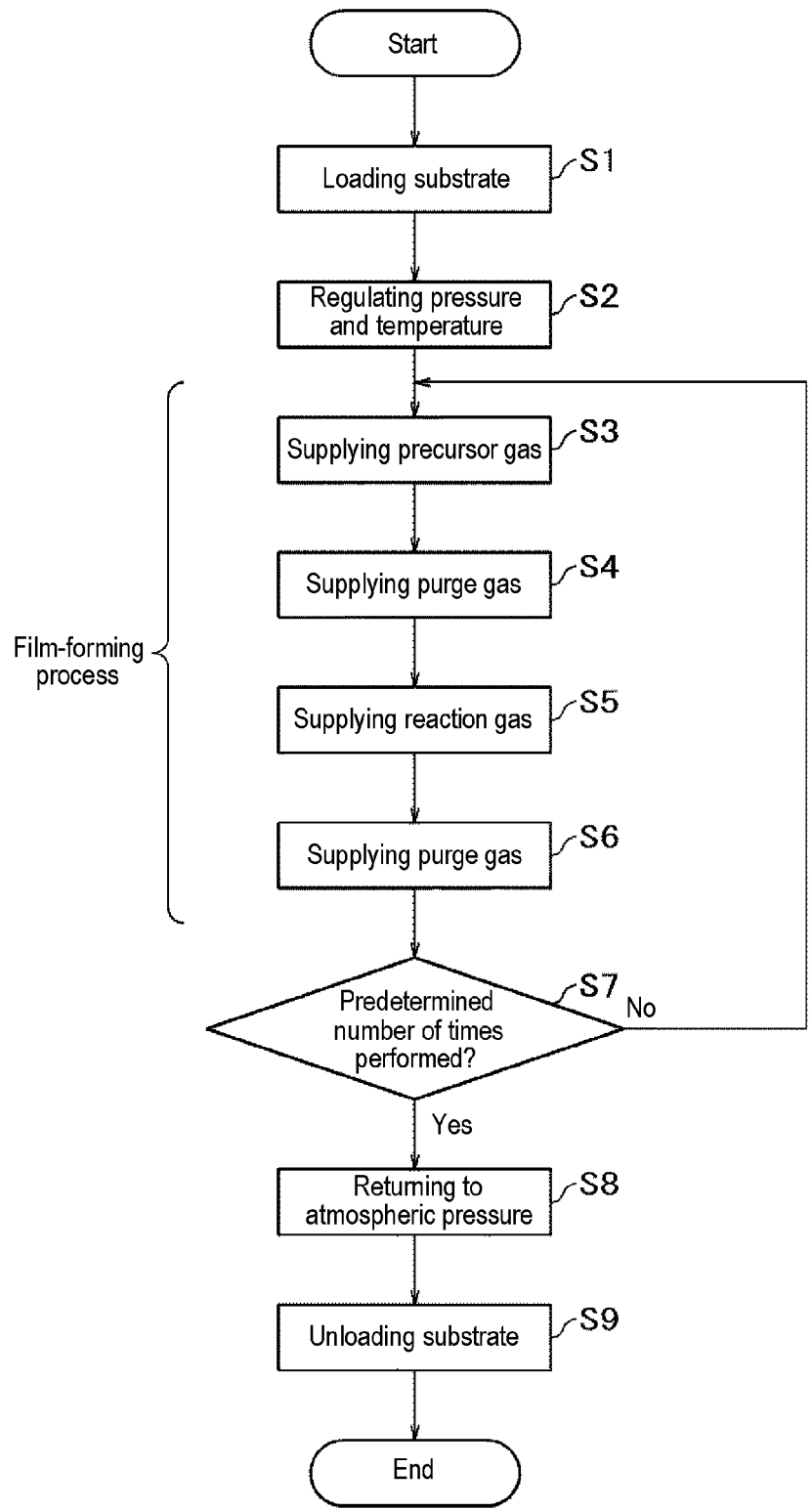
FIG. 7 is a flow chart of an example of a substrate processing process in which the substrate processing apparatus shown in FIG. 1 is used.

Next, as a process of manufacturing a semiconductor device, examples of a process of forming a film on a substrate by using the above-described substrate processing apparatus will be described with reference to FIG. 7. In the following descriptions, the operations of various components constituting the substrate processing apparatus are controlled by the controller 121.

In the present disclosure, for the sake of convenience, the film-forming process sequence shown in FIG. 7 may be denoted as follows. The same notation will be used in description of modifications and other embodiments which will be described later.

$$(BTBAS \rightarrow O_2^*) \times n \Rightarrow SiO$$

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer."

When the term "substrate" is used in the present disclosure, it may be synonymous with the term "wafer."

(Loading Step: S1)

When the boat 217 is charged with a plurality of wafers 200 (wafer charging), the shutter 219s is moved by the shutter opening/closing mechanism 115s and the lower end opening of the manifold 209 is opened (shutter open). After that, as shown in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

(Pressure/Temperature Regulating Step: S2)

The interior of the process chamber 201, that is, a space in which the wafers 200 are placed, is vacuum-exhausted (depressurization-exhausted) by the vacuum pump 246 to reach a desired pressure (degree of vacuum). At this time, the internal pressure of the process chamber 201 is measured by the pressure sensor 245. The APC valve 244 is feedback-controlled based on the measured pressure information. The vacuum pump 246 keeps operating at least until a film-forming step to be described later is completed.

Further, the wafers 200 in the process chamber 201 are heated by the heater 207 to a desired temperature. At this time, the state of supplying electric power to the heater 207 is feedback-controlled based on the temperature information detected by the temperature sensor 263 such that a temperature distribution in the process chamber 201 becomes a desired temperature distribution. The heating of the interior of the process chamber 201 by the heater 207 is continuously performed at least until the film-forming step to be described later is completed. However, when the film-forming step is performed under a temperature condition of equal to or lower than room temperature, the heating of the interior of the process chamber 201 by the heater 207 may not be performed. In the case where the process at such a temperature is performed, the heater 207 may not be used. That is, the heater 207 may not be installed in the substrate processing apparatus. This may simplify of the configuration of the substrate processing apparatus.

Subsequently, rotation of the boat 217 and the wafers 200 by the rotation mechanism 267 is started. The rotation of the boat 217 and the wafers 200 by the rotation mechanism 267 is continuously performed at least until the film-forming step to be described later is completed.

(Film-Forming Step: S3, S4, S5, and S6)

After that, steps S3, S4, S5, and S6 are sequentially executed to perform a film-forming step.

(Precursor Gas Supplying Step: S3 and S4)

At step S3, a BTBAS gas is supplied to the wafers 200 in the process chamber 201.

The valve 243a is opened to allow the BTBAS gas to flow through the gas supply pipe 232a. A flow rate of the BTBAS gas is regulated by the MFC 241a, and the BTBAS gas is supplied from the gas supply hole 250a into the process chamber 201 via the nozzle 249a and is exhausted via the exhaust pipe 231. In this operation, the BTBAS gas supplied to the wafers 200. At the same time, the valve 243c is opened to allow a $N_2$ gas to flow through the gas supply pipe 232c. A flow rate of the $N_2$ gas is regulated by the MFC 241c, and the $N_2$ gas is supplied into the process chamber 201 together with the BTBAS gas and is exhausted via the exhaust pipe 231.

Further, the valves 243d is opened to allow a $N_2$ gas to flow into the gas supply pipe 232d to prevent the BTBAS gas from penetrating into the nozzle 249b. The $N_2$ gas is supplied into the process chamber 201 via the gas supply pipe 232d and the nozzle 249b and is exhausted via the exhaust pipe 231.

The supply flow rate of the BTBAS gas, which is controlled by the MFC 241a, is set to fall within a range of, e.g., 1 to 2,000 sccm, specifically 10 to 1,000 sccm. The supply flow rate of the $N_2$ gas, which is controlled by the MFCs 241c and 241d, are respectively set to fall within a range of, e.g., 100 to 10,000 sccm. The internal pressure of the process chamber 201 is set to fall within a range of, e.g., 1 to 2,666 Pa, specifically 67 to 1,333 Pa, as described above. The supply time of the BTBAS gas to the wafer 200 is set to a range of, e.g., 1 to 100 seconds, specifically 1 to 50 seconds.

The temperature of the heater 207 is set such that the temperature of the wafer 200 falls within a range of, e.g., 0 to 150 degrees C., specifically room temperature (25 degrees C.) to 100 degrees C., more specifically 40 to 90 degrees C. The BTBAS gas is a gas that is easily adsorbed on the wafers 200 or the like and its reactivity is high. Therefore, the BTBAS gas may be chemically adsorbed on the wafers 200 even at a low temperature of, for example, about room temperature, such that a practical film formation rate may be obtained. As in the embodiments of the present disclosure, an amount of heat applied to the wafers 200 may be reduced by setting the temperature of the wafers 200 to 150 degrees C. or lower, specifically 100 degrees C. or lower, and more specifically 90 degrees C. or lower, and accordingly, heat history suffered by the wafers 200 may be controlled. Further, when the temperature of the wafers 200 is 0 degree C. or higher, BTBAS may be sufficiently adsorbed on the wafers 200, such that a sufficient film formation rate may be obtained. Therefore, the temperature of the wafers 200 may be set to fall within a range of 0 to 150 degrees C., specifically room temperature to 100 degrees C., more specifically 40 to 90 degrees C.

By supplying the BTBAS gas to the wafers 200 under the aforementioned conditions, a Si-containing layer of a thickness of, for example, less than one atomic layer (one molecular layer) to several atomic layers (several molecular layers) or so is formed on the wafers 200 (base films of the surfaces of the wafers 200). The Si-containing layer may be a Si layer or a BTBAS adsorption layer, or may include both of them.

The Si layer is a general term including a continuous layer composed of Si, a discontinuous layer composed of Si, and a Si thin film formed by overlapping these layers. Si constituting the Si layer includes those in which a bond with H is not completely broken as well as those in which a bond with an amino group is not completely broken.

The BTBAS adsorption layer includes a discontinuous adsorption layer as well as a continuous adsorption layer composed of BTBAS molecules. The BTBAS molecules constituting the BTBAS adsorption layer also include those in which a bond between Si and an amino group is partially broken, those in which a bond between Si and H is partially broken, and those in which a bond between N and C is partially broken. That is, the BTBAS adsorption layer may be a physical adsorption layer of BTBAS, a chemical adsorption layer of BTBAS, or may include both of them.

Here, a layer of a thickness less than one atomic layer (one molecular layer) means an atomic layer (molecular layer) formed discontinuously, and a layer of a thickness of one atomic layer (one molecular layer) means an atomic layer (molecular layer) formed continuously. The Si-containing layer may include both the Si layer and the BTBAS adsorption layer. However, as described above, with respect to the Si-containing layer, the expressions such as "one atomic layer" and "several atomic layers" are used, and "atomic layer" is used synonymously with "molecular layer."

Under a condition that BTBAS is self-decomposed (thermally decomposed), that is, under a condition that a thermal decomposition reaction of BTBAS occurs, Si is deposited on the wafers 200 to form the Si layer. Under a condition that BTBAS is not self-decomposed (not thermally decomposed), that is, under a condition that the thermal decomposition reaction of BTBAS does not occur, BTBAS is adsorbed on the wafers 200 to form the BTBAS adsorption layer. However, in the embodiments of the present disclosure, since the temperature of the wafers 200 is set to a low temperature of, for example, 150 degrees C. or lower, thermal decomposition of BTBAS is unlikely to occur. As a result, the BTBAS adsorption layer is more likely to be formed on the wafer 200 than the Si layer.

In a case where the thickness of the Si-containing layer formed on the wafers 200 exceeds a several-atomic layer, a modification action in a modifying process to be described later does not reach the entire Si-containing layer. Further, the minimum value of the thickness of the Si-containing layer that may be formed on the wafers 200 is less than one atomic layer. Therefore, the thickness of the Si-containing layer may be set to less than one atomic layer to a several-atomic layer or so. By setting the thickness of the Si-containing layer to be equal to or less than one atomic layer, that is, to one atomic layer or less than one atomic layer, the modification action in the modifying process to be described later may be relatively enhanced, and the time during which modification reaction in the modifying process progresses may be shortened. Further, the time during which the Si-containing layer is formed in the film-forming process may be also shortened. As a result, processing time per cycle may be shortened, and a total processing time may also be shortened. That is, it is also possible to increase the film formation rate. Further, by setting the thickness of the Si-containing layer to one atomic layer or less, it is possible to enhance a controllability of film thickness uniformity.

After the Si-containing layer is formed, the valve 243a is closed to stop the supply of the BTBAS gas into the process chamber 201. At this time, with the APC valve 244 kept open, the interior of the process chamber 201 is vacuum-exhausted by the vacuum pump 246 to remove the unreacted BTBAS gas or the BTBAS gas contributed to the formation of the Si-containing layer and reaction by-products remaining in the process chamber 201 from the process chamber 201 (S4). Further, the valves 243c and 243d are left open to maintain the supply of the $N_2$ gas into the process chamber 201. The $N_2$ gas acts as a purge gas (inert gas). Without this step S4, the precursor gas supplying step may be used.

As the precursor gas, in addition to the BTBAS gas, it may be possible to suitably use a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdimethylaminosilane ($Si[N(CH_3)_2]_2H_2$, abbreviation: BDMAS) gas, a bisdiethylaminosilane ($Si[N(C_2H_5)_2]_2H_2$, abbreviation: BDEAS) gas, or the like. Besides, as the precursor gas, it may be possible to suitably use various kinds of aminosilane precursor gases such as a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, a hexamethyldisilazane (HMDS) gas, and the like, inorganic-based halosilane precursor gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, namely, silicon tetrachloride ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas, and the like, and halogen group-free inorganic-based silane precursor gases such as a monosilane ($SiH_4$, abbreviation: MS) gas, a disilane ($Si_2H_6$, abbreviation: DS) gas, a trisilane ($Si_3H_8$, abbreviation: TS) gas, and the like.

Examples of the inert gas may include rare gases such as an Ar gas, a He gas, a Ne gas, a Xe gas, and the like, in addition to the $N_2$ gas.

(Reaction Gas Supplying Step: S5 and S6)

After the film-forming process is completed, a plasma-excited $O_2$ gas as a reaction gas is supplied to the wafers 200 in the process chamber 201 (S5).

In this step, the opening/closing control of the valves 243b to 243d is performed in the same procedure as the opening/closing control of the valves 243a, 243c, and 243d in the step S3. The flow rate of the $O_2$ gas is regulated by the MFC 241b, and the $O_2$ gas is supplied into the buffer chamber 237 via the nozzle 249b. At this time, high frequency electric power (with a frequency of 13.56 MHz in the embodiments of the present disclosure) is supplied (applied) from the high frequency power supply 273 to the rod-shaped electrodes 269, 270, and 271. The $O_2$ gas supplied into the buffer chamber 237 is excited into a plasma state, supplied as active species ($O^*$, $O_2^*$, $O_3$) to the wafers 200, and exhausted via the exhaust pipe 231. The $O_2$ gas excited into the plasma state is also referred to as oxygen plasma.

The supply flow rate of the $O_2$ gas, which is controlled by the MFC 241b, is set to fall within a range of, e.g., 100 to 10,000 sccm. The high frequency electric power applied from the high frequency power supply 273 to the rod-shaped electrodes 269, 270, and 271 is set to fall within a range of, e.g., 50 to 1,000 W. The internal pressure of the process chamber 201 is set to fall within a range of, e.g., 10 to 300 Pa. By using plasma, the $O_2$ gas may be activated even when the internal pressure of the process chamber 201 is set to such a relatively low pressure zone. The time during which the active species obtained by plasma-excitation of the $O_2$ gas is supplied to the wafers 200 is set to fall within a range of, e.g., 1 to 100 seconds, specifically 1 to 50 seconds. Other process conditions are the same as those in the above-described step S3.

Ions and electrically neutral active species generated in the oxygen plasma are used to perform an oxidation process, which will be described later, on the Si-containing layer formed on the surface of the wafers 200.

By supplying the $O_2$ gas to the wafers 200 under the aforementioned conditions, the Si-containing layer formed on the wafers 200 is plasma-oxidized. At this time, the Si—N bond and Si—H bond of the Si-containing layer are cut by an energy of the plasma-excited $O_2$ gas. N and H, which are separated from the bond with Si, and C, which is bonded to N, are desorbed from the Si-containing layer. Then, Si in the Si-containing layer with a dangling bond due to the desorption of N and the like, is bonded to O contained in the $O_2$ gas to form a Si—O bond. As this reaction proceeds, the Si-containing layer may be changed (modified) into a layer containing Si and O, namely, a silicon oxide layer (SiO layer).

Further, the $O_2$ gas may be plasma-excited and supplied to modify the Si-containing layer into the SiO layer. This is because, even when the $O_2$ gas is supplied in a non-plasma atmosphere, the energy to oxidize the Si-containing layer is insufficient in the above-mentioned temperature zone, and accordingly, it is difficult to increase the Si—O bond by sufficiently desorbing N and Cl from the Si-containing layer or sufficiently oxidizing the Si-containing layer.

After the Si-containing layer is changed into the SiO layer, the valve 243b is closed to stop the supply of the $O_2$ gas. In addition, the supply of the high frequency electric power to the rod-shaped electrodes 269, 270, and 271 is stopped. Then, the $O_2$ gas and reaction by-products remaining in the process chamber 201 are removed from the process chamber 201 according to the same processing procedure and process conditions as in step S4(S6). Without this step S6, the reaction gas supplying step may be used.

As an oxidant, that is, an O-containing gas to be plasma-excited, in addition to the $O_2$ gas, it may be possible to use a nitrous oxide ($N_2O$) gas, a nitric oxide (NO) gas, a nitrogen dioxide ($NO_2$) gas, an ozone ($O_3$), a hydrogen peroxide ($H_2O_2$) gas, water vapor ($H_2O$), an ammonium hydroxide ($NH_4(OH)$) gas, a carbon monoxide (CO) gas, a carbon dioxide ($CO_2$) gas, or the like.

As an inert gas, in addition to the $N_2$ gas, for example, various rare gases exemplified in step S4 may be used.
(Performing Predetermined Number of Times: S7)

A cycle that non-simultaneously, i.e., without synchronization, performs the above-described steps S3, S4, S5, and S6 sequentially is performed a predetermined number of times (n times), that is, one or more times, to thereby form a SiO film of a predetermined composition and a predetermined film thickness on the wafers 200. The above-described cycle may be performed multiple times. That is, a thickness of the SiO layer formed per one cycle may be set to be smaller than a desired film thickness. Thus, the above-described cycle may be performed multiple times until a film thickness of the SiO film formed by laminating the SiO layers becomes equal to the desired film thickness.
(Returning to Atmospheric Pressure Step: S8)

After the above-described film-forming process is completed, a $N_2$ gas as an inert gas is supplied into the process chamber 201 from each of the gas supply pipes 232c and 232d and is exhausted via the exhaust pipe 231. Thus, the interior of the process chamber 201 is purged with the inert gas to remove an $O_2$ gas and the like remaining in the process chamber 201 from the process chamber 201 (inert gas purge). After that, the internal atmosphere of the process chamber 201 is substituted with the inert gas (inert gas substitution) and the internal pressure of the process chamber 201 is returned to an atmospheric pressure (returning to atmospheric pressure: S8).
(Unloading Step: S9)

After that, the seal cap 219 is moved down by the boat elevator 115 to open the lower end of the manifold 209. In addition, the processed wafers 200 supported by the boat 217 are unloaded from the lower end of the manifold 209 to the outside of the reaction tube 203 (boat unloading). After the boat unloading, the shutter 219s is moved, and the lower end opening of the manifold 209 is sealed by the shutter 219s via the O-ring 220c (shutter close). After being unloaded to the outside of the reaction tube 203, the processed wafers 200 are discharged from the boat 217 (wafer discharging). After the wafer discharging, an empty boat 217 may be loaded into the process chamber 201.

Here, the pressure inside the furnace at the time of substrate processing may be controlled in a range of 10 Pa to 300 Pa. This is because when the pressure inside the furnace is lower than 10 Pa, since the mean free path of gas molecules becomes longer than the Debye length of the plasma and the plasma that directly hits a furnace wall becomes greater, it becomes difficult to suppress generation of particles. Further, this is because when the pressure inside the furnace is higher than 300 Pa, since a plasma generation efficiency is saturated, plasma generation amount does not change even when a reaction gas is supplied, and the reaction gas may be wasted, and at the same time, the mean free path of gas molecules becomes short, and accordingly, an efficiency of transportation of plasma active species to the wafers becomes deteriorated.

(3) Effects of the Embodiments

According to the embodiments of the present disclosure, one or more effects set forth below may be achieved.

(a) By setting the lengths of the rod-shaped electrode 269 and the rod-shaped electrode 271 to be different from each other, it is possible to make the supply amount of the active species generated in the buffer chamber 237 and supplied into the process chamber 201 uniform among the plurality of substrates.

(b) By regulating the lengths of the rod-shaped electrodes 269 and 271, it is possible to regulate the supply amount of the active species generated in the buffer chamber 237 and supplied into the process chamber 201 to be uniform among the plurality of substrates.

(c) By regulating the lengths of the rod-shaped electrodes 269 and 271, it is possible to regulate the supply amount of the active species generated in the buffer chamber 237 and supplied into the process chamber 201 to be vertically symmetrical.
(First Modification)

Next, modifications of the embodiments of the present disclosure will be described with reference to FIG. 8. In this first modification, components different from those of the above-described embodiments will be described below, and description of the same components will be omitted.

In the above-described embodiments, the configuration in which the buffer structure 300 is installed at the inner wall of the reaction tube 203 and the rod-shaped electrodes 269, 270, and 271, each of which is covered with the electrode protection tube 275, and the nozzle 249b are installed inside the buffer structure 300 are described above in detail. However, in this modification, a buffer structure 400 of the same configuration as the buffer structure 300 is further installed at the inner wall of the reaction tube 203.

Rod-shaped electrodes 369, 370, and 371, each of which is covered with the electrode protection tube 275, and a nozzle 249c are installed inside the buffer structure 400. Among the rod-shaped electrodes 369, 370, and 371, the rod-shaped electrodes 369 and 371 as application electrodes, which are disposed at both ends thereof, are connected to a high frequency power supply 373 via a matcher 372, and the rod-shaped electrode 370 as a reference electrode is connected and grounded to the earth which is a reference potential. The nozzle 249c is connected to the gas supply pipe 232b and may supply the same gas as the nozzle 249b. A plurality of gas supply holes 250c configured to supply a gas are formed at the side surface of the nozzle 249c to span from the lower portion to the upper portion of the reaction tube 203. Each gas supply hole 250c is opened toward a wall surface formed in the radial direction with respect to the arc-shaped wall surface of the buffer structure 400, thereby allowing a gas to be supplied toward the wall surface. Gas supply ports 402, 404, and 406 configured to supply a gas into the buffer chamber 237 are installed at the arc-shaped wall surface of the buffer structure 400. The gas supply ports 402, 404, and 406 are each opened toward the center of the reaction tube 203 at positions facing plasma generation regions 324a and 324b between the rod-shaped electrodes 369 and 370, between the rod-shaped electrodes 370 and 371, and between the rod-shaped electrode 371 and the nozzle 249c. A plurality of gas supply ports 402, 404, and 406 are installed over a region from the lower portion to the upper portion of the reaction tube 203, each of which is formed with the same opening area at the same opening pitch.

Figure 8:
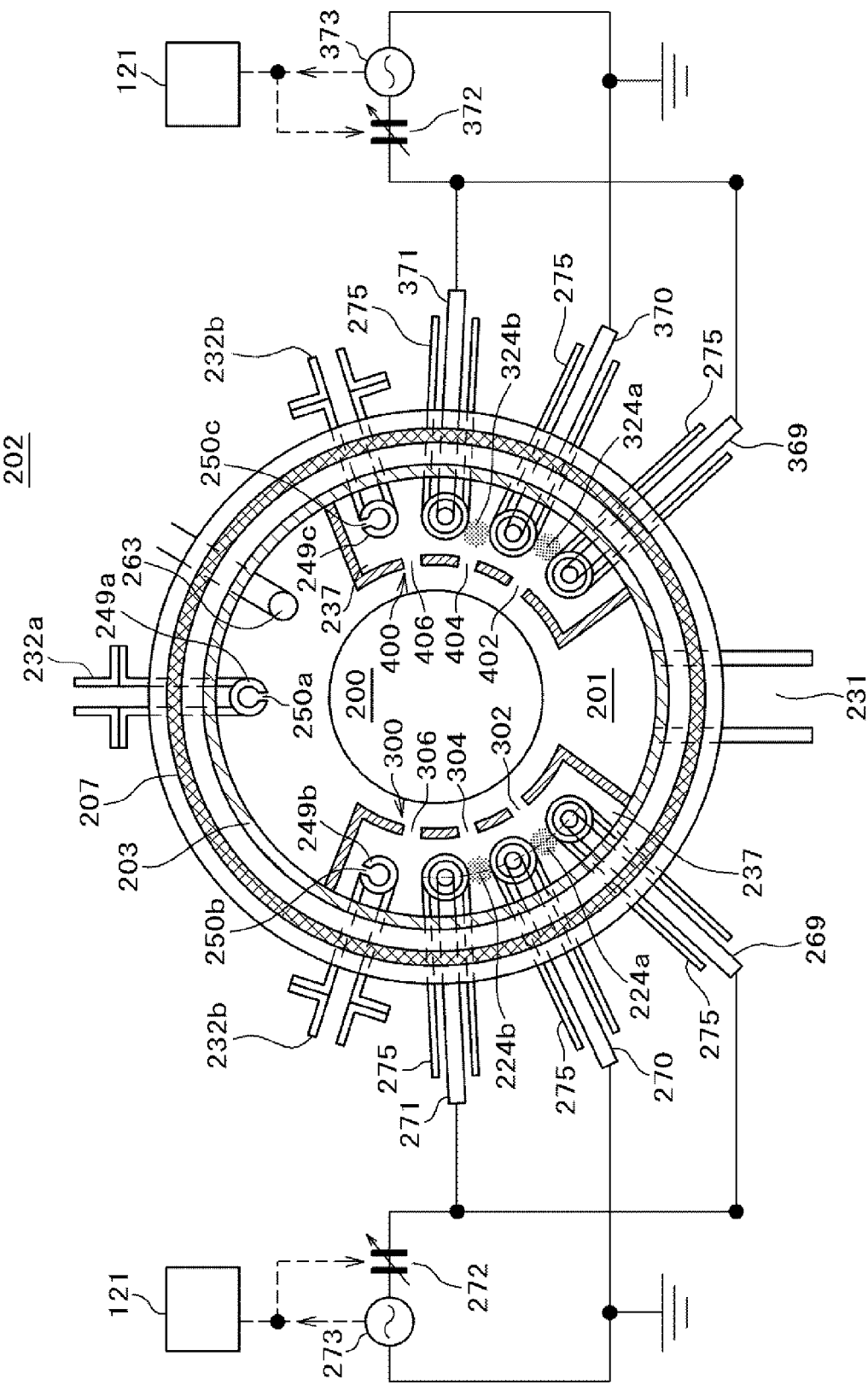
FIG. 8 is a schematic cross-sectional view that explains a first modification of a vertical process furnace of a substrate processing apparatus suitably used in embodiments of the present disclosure.

As shown in FIG. 8, in a plane view, the buffer structure 300 and the buffer structure 400 are installed in line symmetry with respect to a straight line passing through the exhaust pipe 231 and the center of the reaction pipe 203, with the exhaust pipe 231 interposed therebetween. Further, in the plane view, the nozzle 249a is installed at a position facing the exhaust pipe 231 with the wafers 200 interposed therebetween. Further, the nozzle 249b and the nozzle 249c are each installed at positions far from the exhaust pipe 231 in the buffer chamber 237.

In this modification, two buffer structures each including a plasma generator are installed, and each of the buffer structures 300 and 400 includes the high frequency power supplies 273 and 373 and the matchers 272 and 372. Each of the high frequency power supplies 273 and 373 is connected to the controller 121, and plasma control of each of the buffer chambers 237 of the buffer structures 300 and 400 becomes possible. That is, the controller 121 monitors impedance of each plasma generator and independently controls each of the high frequency power supplies 273 and 373 such that the amount of active species is not biased in each buffer chamber 237. When the impedance is large, the controller 121 controls to increase the power of the high frequency power supply. As a result, as compared with a case where there is one plasma generator, a sufficient amount of active species may be supplied to the wafers even when the high frequency power of each plasma generator is reduced, thereby enhancing an in-plane uniformity of the wafers. In addition, as compared with a case where plasma control is performed on two plasma generators with one high frequency power supply, by installing a high frequency power supply for each plasma generator, it is easy to grasp an abnormality such as disconnection, which occurs in each plasma generator. Further, since a distance between the high frequency power supply and each electrode may be easily regulated, it is possible to easily suppress a difference in RF power application caused by a difference in the distance between each electrode and the high frequency power supply.

(Second Modification)

Figure 9:
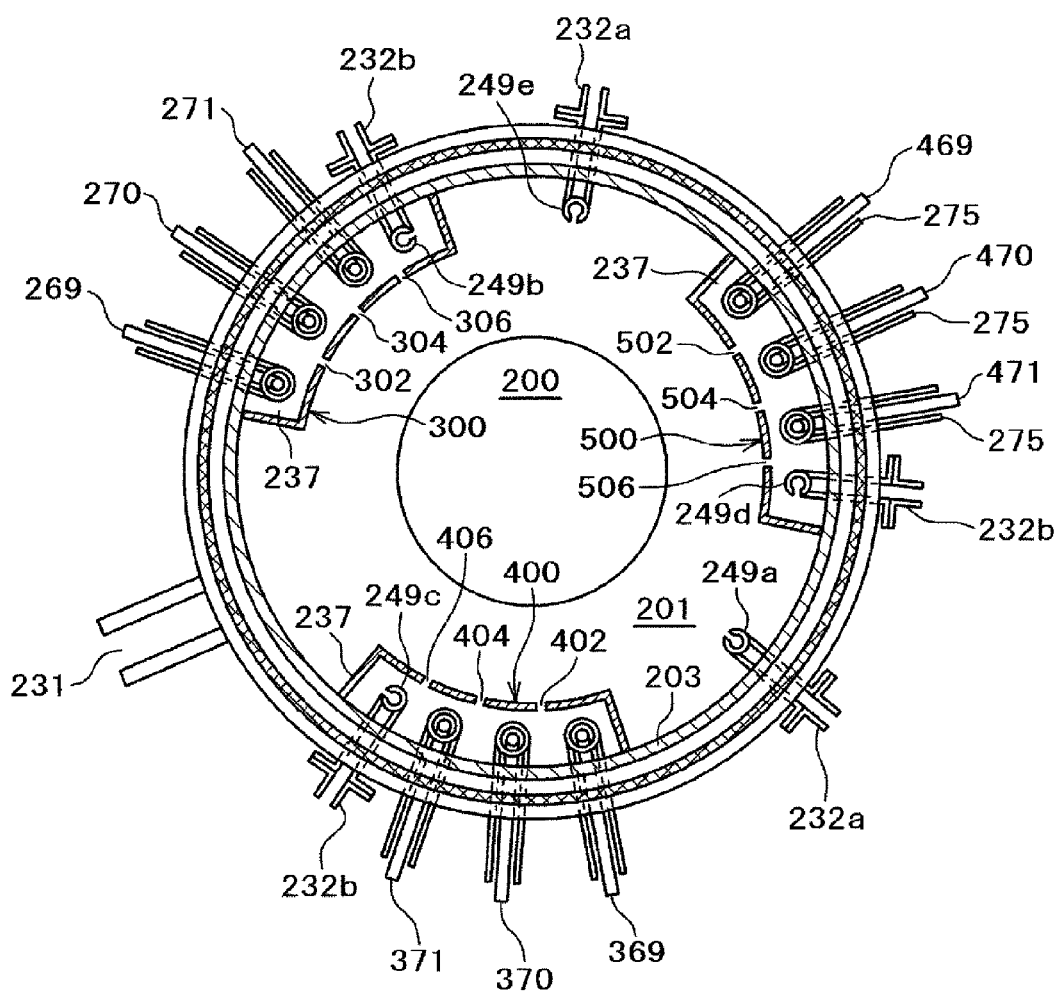
FIG. 9 is a schematic cross-sectional view that explains a second modification of a vertical process furnace of a substrate processing apparatus suitably used in embodiments of the present disclosure.
Figure 10:
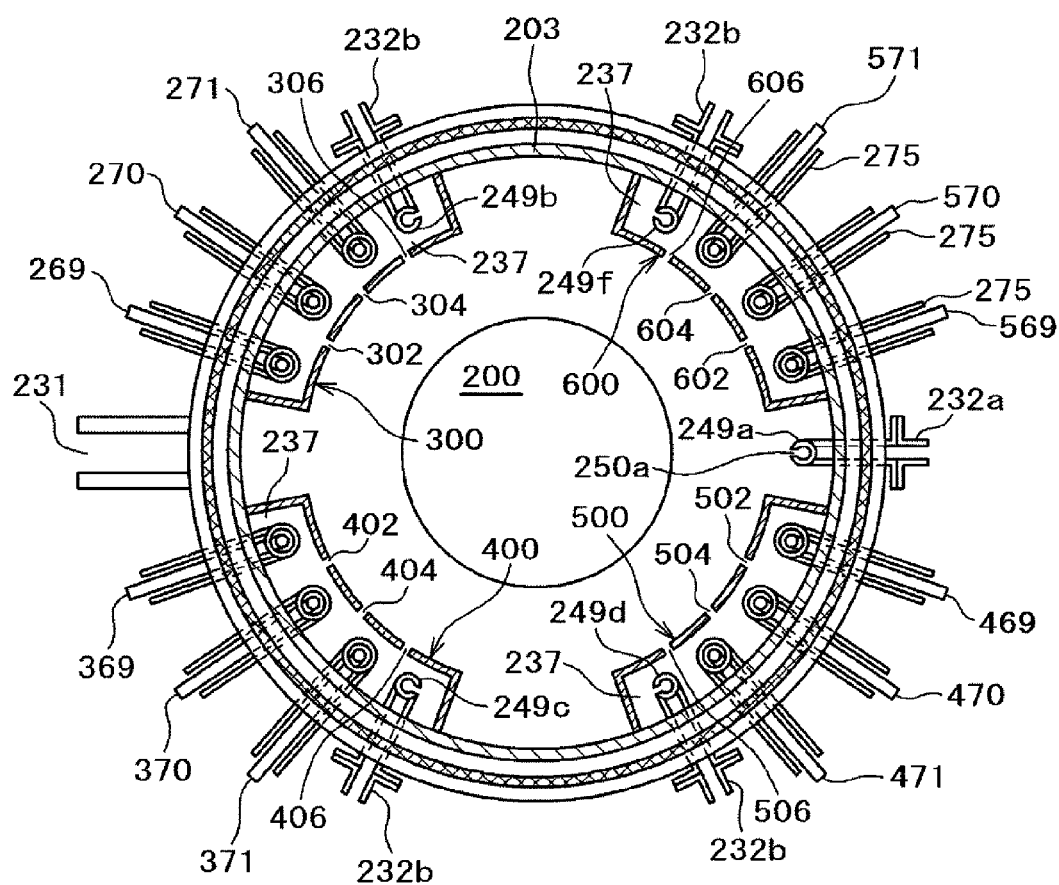
FIG. 10 is a schematic cross-sectional view for explains a third modification of a vertical process furnace of a substrate processing apparatus suitably used in embodiments of the present disclosure.

Next, a second modification of the embodiments of the present disclosure will be described with reference to FIG. 9. In the second modification, three buffer structures each including a plasma generator are installed at the inner wall of the reaction tube 203, and two nozzles configured to supply a precursor gas are installed.

Similar to the buffer structures 300 and 400, rod-shaped electrodes 469, 470, and 471, each of which is covered with the electrode protection tube 275, and a nozzle 249d are installed inside a buffer structure 500. The rod-shaped electrodes 469 and 471 as application electrodes are connected to a high frequency power supply via a matcher (not shown), and the rod-shaped electrode 470 as a reference electrode is connected and grounded to the earth which is a reference potential. The nozzle 249d is connected to the gas supply pipe 232b and may supply the same gas as the nozzle 249b. Gas supply ports 502, 504, and 506 configured to supply a gas are installed between the electrodes on the arc-shaped wall surface of the buffer structure 500. The gas supply ports 502, 504, and 506 are each opened toward the center of the reaction tube 203 at positions facing plasma generation regions between the rod-shaped electrodes 469 and 470, between the rod-shaped electrodes 470 and 471, and between the rod-shaped electrode 471 and the nozzle 249d. A plurality of gas supply ports 502, 504, and 506 are installed over a region from the lower portion to the upper portion of the reaction tube 203, each of which is formed with the same opening area at the same opening pitch. Further, the nozzle 249e is connected to the gas supply pipe 232a and may supply the same gas as the nozzle 249a.

The buffer structure 300 and the buffer structure 400 are installed in line symmetry with respect to a straight line passing through the exhaust pipe 231 and the center of the reaction pipe 203, with the exhaust pipe 231 interposed therebetween. Further, the buffer structure 500 is installed at a position facing the exhaust pipe 231 with the wafers 200 interposed therebetween. The nozzles 249a and 249e configured to supply a precursor gas are installed between the buffer structure 300 and the buffer structure 500 and between the buffer structure 400 and the buffer structure 500, respectively. Further, the nozzles 249b, the nozzles 249c, and the nozzles 249d configured to supply a reaction gas are arranged on the same side in the buffer chamber 237, and gas supply holes of the nozzles 249b, the nozzles 249c, and the nozzles 249d are opened toward the wall surfaces formed in the radial direction with respect to the arc-shaped wall surfaces of the buffer structures 300, 400, and 500, respectively.

The second modification may also obtain the same effects as those of the above-described embodiments and the first modification.

(Third Modification)

Next, a third modification of the embodiments of the present disclosure will be described with reference to FIG.

10. In this third modification, four buffer structures each including a plasma generator are installed at the inner wall of the reaction tube 203.

Similar to the buffer structures 300, 400, and 500, rod-shaped electrodes 569, 570, and 571, each of which is covered with the electrode protection tube 275, and a nozzle 249f are installed inside a buffer structure 600. The rod-shaped electrodes 569 and 571 as application electrodes are connected to a high frequency power supply via a matcher (not shown), and the rod-shaped electrode 570 as a reference electrode is connected and grounded to the earth which is a reference potential. The nozzle 249f is connected to the gas supply pipe 232b and may supply the same gas as the nozzle 249b. Gas supply ports 602, 604, and 606 configured to supply a gas are installed between the electrodes on the arc-shaped wall surface of the buffer structure 600. The gas supply ports 602, 604, and 606 are each opened toward the center of the reaction tube 203 at positions facing plasma generation regions between the rod-shaped electrodes 569 and 570, between the rod-shaped electrodes 570 and 571, and between the rod-shaped electrode 471 and the nozzle 249f. A plurality of gas supply ports 602, 604, and 606 are installed over a region from the lower portion to the upper portion of the reaction tube 203, each of which is formed with the same opening area at the same opening pitch.

The buffer structures 300, 400, 500, and 600 are installed at equal intervals. Further, the nozzle 249a is installed at a position facing the exhaust pipe 231 with the wafers 200 interposed therebetween. The nozzle 249b and the nozzle 249c are installed on the side far from the exhaust pipe 231 in the buffer chamber 237. Further, the nozzle 249d and the nozzle 249f are installed on the exhaust pipe 231 side in the buffer chamber 237, and gas supply holes of the nozzle 249b, the nozzle 249c, the nozzle 249d, and the nozzle 249f are opened toward the wall surfaces formed in the radial direction with respect to the arc-shaped wall surfaces of the buffer structures 300, 400, 500, and 600, respectively.

In the third modification may also obtain the same effects as the above-described embodiments and the first modification.

The embodiments of the present disclosure are described above in detail. However, the present disclosure is not limited to the above-described embodiments, and various changes may be made without departing from the gist thereof.

Further, for example, in the above-described embodiments, the example in which the gas is excited (activated) into the plasma state by one buffer structure 300 to supply active species to the wafers is described. The present disclosure is not limited to such embodiments, but may be a form in which a plasma state is made by a plurality of buffer structures to supply the active species to the wafers. That is, by installing the plurality of buffer structures, it is possible to increase the supply amount of the active species, thereby increasing the film formation rate.

Further, for example, in the above-described embodiments, the example in which the reactant is supplied after the precursor is supplied is described. However, the present disclosure is not limited to such embodiments, but the supply order of the precursor and the reactant may be reversed. That is, the precursor may be supplied after the reactant is supplied. By changing the supply order, it is possible to change a film quality and a composition ratio of a formed film.

In the above-described embodiments and the like, the example in which the SiO film is formed on the wafers 200 is described. The present disclosure is not limited to such embodiments, but may be also suitably applied to a case of forming a Si-based oxide film such as a silicon oxycarbide film (SiOC film), a silicon oxycarbonitride film (SiOCN film), or a silicon oxynitride film (SiON film) on the wafers 200.

For example, alternative to or in addition to the above-mentioned gases, a nitrogen (N)-containing gas such as an ammonia ($NH_3$) gas, a carbon (C)-containing gas such as a propylene ($C_3H_6$) gas, a boron (B)-containing gas such as a boron trichloride ($BCl_3$) gas, or the like may be used to form, for example, a SiN film, a SiON film, a SiOCN film, a SiOC film, a SiCN film, a SiBN film, a SiBCN film, a BCN film, or the like. The order in which each gas is flowed may be changed as appropriate. Even when such film formation is performed, the film formation may be performed under the same process conditions as in the above-described embodiments, and the same effects as in the above-described embodiments may be obtained. In these cases, the above-mentioned reaction gas may be used as an oxidant as the reaction gas.

Further, the present disclosure may be suitably applied to a case of forming a metal-based oxide film or a metal-based nitride film containing a metal element such as titanium (Ti), zirconium (Zr), hafnium (Hf), tantalum (Ta), niobium (Nb), aluminum (Al), molybdenum (Mo), or tungsten (W), on the wafers 200. That is, the present disclosure may be suitably applied to a case of forming a TiO film, a TiOC film, a TiOCN film, a TiON film, a TiN film, a TiSiN film, a TiBN film, a TiBCN film, a ZrO film, a ZrOC film, a ZrOCN film, a ZrON film, a ZrN film, a ZrSiN film, a ZrBN film, a ZrBCN film, a HfO film, a HfOC film, a HfOCN film, a HfON film, a HfN film, a HfSiN film, a HfBN film, a HfBCN film, a TaO film, a TaOC film, a TaOCN film, a TaON film, a TaN film, a TaSiN film, a TaBN film, a TaBCN film, a NbO film, a NbOC film, a NbOCN film, a NbON film, a NbN film, a NbSiN film, a NbBN film, a NbBCN film, an AlO film, an AlOC film, an AlOCN film, an AlON film, an AlN film, an AlSiN film, an AlBN film, an AlBCN film, a MoO film, a MoOC film, a MoOCN film, a MoON film, a MoN film, a MoSiN film, a MoBN film, a MoBCN film, a WO film, a WOC film, a WOCN film, a WON film, a WN film, a WSiN film, a WBN film, a WBCN film, or the like, on the wafers 200.

In this case, as the precursor gas, it may be possible to use, e.g., a tetrakis(dimethylamino)titanium ($Ti[N(CH_3)_2]_4$, abbreviation: TDMAT) gas, a tetrakis(ethylmethylamino)hafnium ($Hf[N(C_2H_5)(CH_3)]_4$, abbreviation: TEMAH) gas, a tetrakis(ethylmethylamino)zirconium ($Zr[N(C_2H_5)(CH_3)]_4$, abbreviation: TEMAZ) gas, a trimethylaluminum ($Al(CH_3)_3$, abbreviation: TMA) gas, a titanium tetrachloride ($TiCl_4$) gas, a hafnium tetrachloride ($HfCl_4$) gas, or the like.

That is, the present disclosure may be suitably applied to a case of forming a half metal-based film containing a half metal element or a metal-based film containing a metal element. The processing procedures and process conditions of this film-forming process may be the same as those of the film-forming processes described in the above-described embodiments and modifications. These cases may obtain the same effects as in the above-described embodiments.

Recipes used in the film-forming process may be provided individually according to the processing contents and are stored in the memory 121c via a telecommunication line or the external memory 123. Then, when starting various types of processes, the CPU 121a may properly select an appropriate recipe from the recipes stored in the memory 121c according to the processing contents. Thus, it is possible to form thin films of various film types, composition ratios, film qualities, and film thicknesses with a single substrate processing apparatus in a versatile and well-reproducible manner. Further, it is possible to reduce an operator's operation burden and to quickly start the various types of processes while avoiding an operation error.

The above-mentioned recipes are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. Further, the existing recipes already installed in the substrate processing apparatus may be directly modified by operating the input/output device 122 of the substrate processing apparatus.

According to some embodiments of the present disclosure, it is possible to provide a technique capable of simultaneously exhibiting the same substrate processing performance on a plurality of substrates.

While certain embodiments are described above, these embodiments are presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a process chamber in which at least one substrate is processed; and
at least one buffer chamber in which plasma is formed,
wherein the at least one buffer chamber includes at least two application electrodes of different lengths to which high frequency electric power is applied, and a reference electrode subjected to a reference potential, and
wherein, in the at least one buffer chamber, the at least two application electrodes, which use the reference electrode in common, are arranged such that the at least two application electrodes have lengths different from each other and upper ends of the at least two application electrodes are set to be respectively disposed at positions whose heights are different from each other.

2. The substrate processing apparatus of claim 1, wherein the at least one substrate includes a plurality of substrates, and
wherein the substrate processing apparatus further comprises a substrate support configured to mount and support the plurality of substrates.

3. The substrate processing apparatus of claim 1, wherein the lengths of the at least two application electrodes are set to be different in a stack direction of the at least one substrate.

4. The substrate processing apparatus of claim 1, further comprising an electrode protection tube configured to protect the at least two application electrodes and the reference electrode.

5. The substrate processing apparatus of claim 4, wherein the electrode protection tube is formed in a U-shape in an upper portion of the at least one buffer chamber, and is configured such that length of at least one of the at least two application electrodes is adjustable in the electrode protection tube formed in the U-shape.

6. The substrate processing apparatus of claim 5, wherein the at least one of the at least two application electrodes is disposed to be folded back at a U-shaped bent portion of the electrode protection tube such that at least one upper end of the at least one of the at least two application electrodes is located at an upper portion of the electrode protection tube.

7. The substrate processing apparatus of claim 4, wherein the electrode protection tube is configured such that the at least two application electrodes do not come into contact with each other.

8. The substrate processing apparatus of claim 7, wherein the electrode protection tube is formed in a constricted shape such that the at least two application electrodes do not come into contact with each other.

9. The substrate processing apparatus of claim 4, wherein the electrode protection tube includes a quartz tube configured to protect at least one of the at least two application electrodes and a quartz tube configured to protect the reference electrode, and
wherein the quartz tube configured to protect the at least one of the at least two application electrodes and the quartz tube configured to protect the reference electrode are connected in an upper portion of the at least one buffer chamber.

10. The substrate processing apparatus of claim 1, wherein the reference electrode is located between the at least two application electrodes.

11. The substrate processing apparatus of claim 1, wherein the at least one buffer chamber is installed inside the process chamber.

12. The substrate processing apparatus of claim 1, wherein the at least one buffer chamber includes a plurality of buffer chambers installed inside the process chamber.

13. The substrate processing apparatus of claim 1, wherein the at least one buffer chamber is installed along an inner wall of a reaction tube that forms the process chamber.

14. The substrate processing apparatus of claim 1, further comprising a heater configured to heat the at least one substrate.

15. The substrate processing apparatus of claim 1, further comprising a high frequency power supply configured to supply the high frequency electric power to the at least two application electrodes.

16. The substrate processing apparatus of claim 1, wherein one application electrode among the at least two application electrodes is shorter than the reference electrode.

17. The substrate processing apparatus of claim 1, wherein, in a stack direction of the at least one substrate, one application electrode among the at least two application electrodes is shorter than the reference electrode in the at least one buffer chamber.

18. A plasma generating apparatus comprising:
at least one buffer chamber in which plasma is formed;
at least two application electrodes of different lengths to which high frequency electric power is applied; and
a reference electrode subjected to a reference potential,
wherein in the at least one buffer chamber, the at least two application electrodes, which use the reference electrode in common, are arranged such that the at leasts two application electrodes have lengths different from each other and upper ends of the at least two application electrodes are set to be respectively disposed at positions whose heights are different from each other.

* * * * *